(12) United States Patent
Park et al.

(10) Patent No.: US 8,178,894 B2
(45) Date of Patent: May 15, 2012

(54) LIGHT EMITTING DEVICE PACKAGE AND METHOD OF FABRICATING THE SAME

(75) Inventors: Jun Seok Park, Gwangju (KR); Seok Hoon Kang, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/824,824

(22) Filed: Jun. 28, 2010

(65) Prior Publication Data

US 2010/0277948 A1 Nov. 4, 2010

Related U.S. Application Data

(62) Division of application No. 11/720,221, filed as application No. PCT/KR2006/002169 on Jun. 7, 2006, now Pat. No. 7,977,699.

(30) Foreign Application Priority Data

Jun. 24, 2005 (KR) .......................... 10-2005-0054933

(51) Int. Cl.
*H01L 33/00* (2010.01)

(52) U.S. Cl. ............. 257/99; 386/146; 386/129; 362/84

(58) Field of Classification Search ..................... 362/84; 386/146, 129; 257/99
See application file for complete search history.

(56) References Cited

U.S. PATENT DOCUMENTS

| 6,652,795 B2 | 11/2003 | Konishi et al. |
| 6,858,870 B2 | 2/2005 | Lee |
| 6,881,980 B1 | 4/2005 | Ting |
| 7,218,830 B2 * | 5/2007 | Iimura ........................ 385/146 |
| 2003/0022407 A1 | 1/2003 | Sakamoto et al. |
| 2003/0189830 A1 | 10/2003 | Sugimoto et al. |
| 2004/0041757 A1 | 3/2004 | Yang et al. |
| 2004/0223315 A1 * | 11/2004 | Suehiro et al. ................. 362/84 |
| 2006/0119250 A1 | 6/2006 | Suehiro et al. |
| 2006/0232725 A1 | 10/2006 | Chua et al. |

FOREIGN PATENT DOCUMENTS

| CN | 1312586 A | 9/2001 |
| JP | 61-001067 A | 1/1986 |
| JP | 61001067 A | 1/1986 |
| JP | 61-237485 A | 10/1986 |
| JP | 04-65464 U | 6/1992 |
| JP | 07-283441 A | 10/1995 |
| JP | 2000-012576 A | 1/2000 |

(Continued)

OTHER PUBLICATIONS

Office Action dated Oct. 23, 2011 in Japanese Application No. 2008-518019, filed Jun. 7, 2006.

*Primary Examiner* — Jerome Jackson, Jr.
*Assistant Examiner* — Dale E Page
(74) *Attorney, Agent, or Firm* — Saliwanchik, Lloyd & Eisenschenk

(57) ABSTRACT

A light emitting device package and a method of manufacturing the light emitting device package are provided. A base is first provided and a hole is formed on the base. After a light emitting portion is formed on the base, a mold die is placed on the light emitting portion and a molding material is injected through the hole. The mold die is removed to complete the package.

11 Claims, 8 Drawing Sheets

FOREIGN PATENT DOCUMENTS

| | | |
|---|---|---|
| JP | 2001-223285 A | 8/2001 |
| JP | 2002-094122 A | 3/2002 |
| JP | 2003-036707 A | 2/2003 |
| JP | 2003-218408 A | 7/2003 |
| JP | 2004-140327 A | 5/2004 |
| JP | 2004-207369 A | 7/2004 |
| KR | 10-2004-0044701 | 5/2004 |
| KR | 10-2004-0044701 A | 5/2004 |
| KR | 10-2003-0051315 | 2/2005 |
| KR | 10-2005-0012372 A | 2/2005 |

* cited by examiner

LIGHT EMITTING DEVICE PACKAGE AND METHOD OF FABRICATING THE SAME

CROSS-REFERENCE TO RELATED APPLICATIONS

This application is a divisional of U.S. application Ser. No. 11/720,221, filed May 25, 2007, now U.S. Pat. No. 7,977,699, issued Jul. 12, 2011, which is the U.S. national stage application of International Patent Application No. PCT/KR2006/002169, filed Jun. 7, 2006, which claims priority to Korean Patent Application No. 10-2005-0054933, filed Jun. 24, 2005, all of which are incorporated herein by reference in their entirety.

TECHNICAL FIELD

The present invention relates to a light emitting device package and a method of manufacturing the same.

BACKGROUND ART

A light emitting device is a semiconductor device that converts electrical energy into light such as infrared lays, visible rays, and ultraviolet rays using a characteristic of a compound semiconductor. A typical example of the light emitting device is a light emitting diode (LED). The LEDs are widely used for home appliances, a remote controller, an electronic display board, a display device, a variety of automation apparatuses, and the like and classified into an infrared emitting diode (IRED) and a visible light emitting diode (VLED).

A blue LED is structure to include a sapphire substrate. An N-type GaN layer is formed on the sapphire substrate and an N-metal is formed on a portion of the N-type GaN layer. A portion except for the portion on which the N-metal is formed defines an active layer.

A P-type GaN layer is formed on the active layer and a P-metal is formed on the P-type GaN layer. The active layer is a light emitting layer that generates light by the combination of holes transmitted through the P-metal and electrons transmitted through the N-metal.

Meanwhile, a liquid crystal display (LCD), which is one of flat panel displays, is a device that varies optical anisotropy of the liquid crystal by applying electric field to the liquid crystal having both a liquidity property of liquid and an optical property of a crystal. The LCD has been widely used as it has a variety of advantages over a cathode ray tube (CRT) in power consumption, a thickness, a screen size, and a superfine display.

The LCD includes an LCD panel, a backlight, a printed circuit board (PCB), and a module holder. The LCD panel includes a lower substrate on which a transparent electrode pattern and pixel electrodes are connected to switching elements and an upper substrate on which common electrodes are formed. Liquid crystal is filled in a space defined between the upper and lower substrates. The backlight is a light source for emitting light to the LCD panel. An LED panel manufactured by an array of LED packages is generally used as the backlight.

The PCB includes a power supply/control module such as an integrated power module. The module holder includes a rectangular frame for fixing the above-described elements.

FIG. 1 is a side sectional view of a conventional LED panel 10.

Referring to FIG. 1, a PCB 15 on which light emitting devices 12 and conductive lines 14 are formed is attached on an inner lower portion of a rectangular frame 11. A molding layer 13 for dispersing the light of the light emission elements 12 is formed inside the frame 11. A diffusing plate 16 is attached on a top of the frame 11. At this point, a distance between the diffusing plate 16 and the light emitting devices 12 is greater than 5 mm to increase the luminescence.

In the above-described LED panel 10, the light that is diffuse-reflected toward the light emitting devices 12 can not be utilized. In addition, since the distance between the diffusing plate 16 and the light emitting devices 12 must be maintained above 5 mm, it is difficult to reduce the weight and thickness of the LED panel 10.

In addition, when intensity of the current applied to the light emitting devices 12 increases to generate high output light, the heat dissipation performance in the package is not good to generate heat in the package. When the internal heat is not effectively dissipated, the resistance increases to deteriorate the light efficiency.

Particularly, the conventional LED panel 10 is designed such that the light emitting devices 12 that emit light in a specific direction (e.g., in an upward direction) are independently arranged without the light interference between them, it is difficult to display white light that can be realized by mixing red (R), green (G) and blue (B) colors.

DETAILED DISCLOSURE

Technical Problem

The present invention provides a light emitting device package that can be easily manufactured by forming a molding portion using a molding technique.

The present invention provides a light emitting device package and a method of manufacturing the light emitting device package, in which heat generated from an LED chip can be dissipated to an external side and the light loss can be minimized by directly mounting the LED chip on a PCB and forming a molding portion using a transfer molding process.

Technical Solution

A light emitting device package according to the present invention includes: a base; a light emitting portion formed on the base; and a molding portion transfer-molded on the light emitting portion.

A method of manufacturing a light emitting device package according to the present invention includes providing a base; forming a hole on the base; forming a light emitting portion on the base; placing a mold die on the light emitting portion; injecting a molding material through the hole; and removing the mold die.

Advantageous Effects

According to an embodiment of the present invention, the process for manufacturing the light emitting device package can be simplified.

According to an embodiment of the present invention, a heat dissipation property and a color mixture property of the light emitting device package can be improved.

BEST MODE

According to an aspect of the present invention, there is provided a light emitting device package including: a base; a light emitting portion formed on the base; and a molding portion transfer-molded on the light emitting portion.

According to another aspect of the present invention, there is provided a method of manufacturing a light emitting device package, including: providing a base; forming a hole on the base; forming a light emitting portion on the base; placing a mold die on the light emitting portion; injecting a molding material through the hole; and removing the mold die.

According to still another aspect of the present invention, there is provided a method of manufacturing a light emitting device package, including: providing a base; forming a light emitting portion on the base; placing a mold die provided with a hole on the light emitting portion; injecting a molding material through the hole; and removing the mold die.

According to still yet another aspect of the present invention, there is provided a method of manufacturing a light emitting device package, including: providing a base; forming a plurality of light emitting portions on the base; placing a mold die engraved with a shape corresponding to the molding portions on the light emitting portions; injecting a molding material in a space between the base and the mold die; and removing the mold die.

According to sill yet another aspect of the present invention, there is provided a light emitting device package including: a base; a plurality of light emitting portions formed on the base; and a plurality of molding portions coupled and hardened on the base or the respective light emitting portions.

MODE FOR INVENTION

Figure 1:
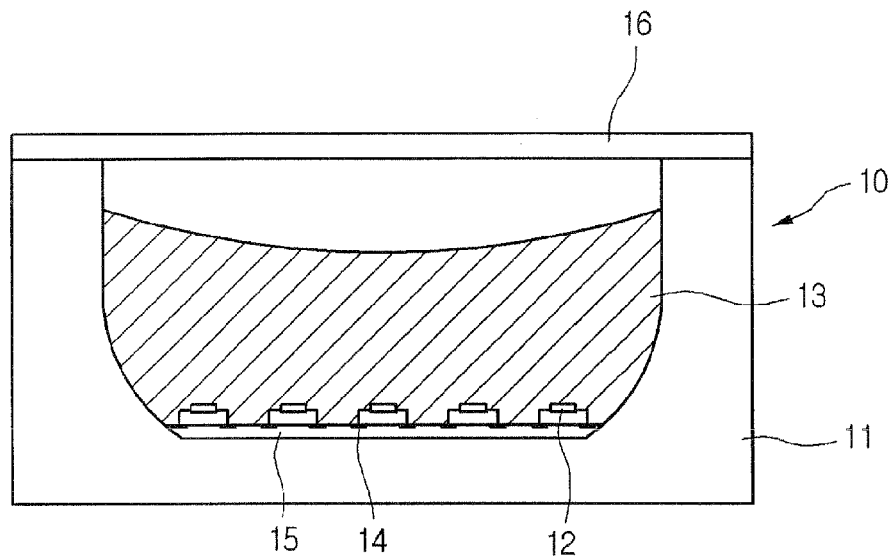
FIG. 1 is a side sectional view of a conventional LED panel.
Figure 2:
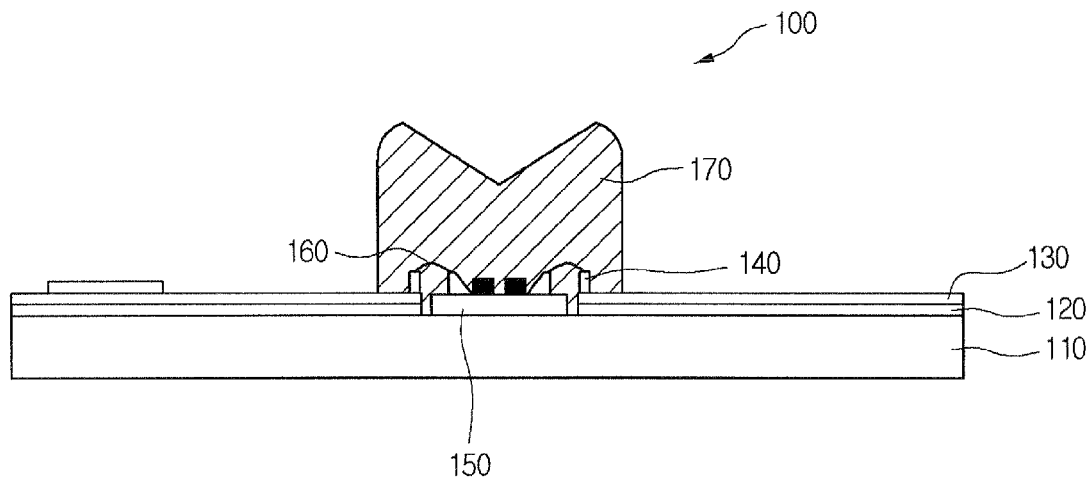
FIG. 2 is a sectional view of an internal structure of a light emitting device package according to an embodiment of the present invention.

FIG. 2 is a sectional view of an internal structure of a light emitting device package according to an embodiment of the present invention;

Referring to FIG. 2, a light emitting device package 100 of this embodiment includes a base, a light emitting portion, and a molding portion formed on the light emitting portion.

In specification, the term, 'on' represents that an element is contacted directly or indirectly to another element.

The base includes a PCB 110, an insulation layer 120, and a circuit layer 130.

The PCB 110 may be a metal PCB, i.e., a metal core printed circuit board MCPCB. The PCB 110 includes a circuit layer 130 and an insulation layer 120 that are formed and supported thereon.

The PCB 110 allows heat generated from the light emitting portion to be dissipated downward.

The light emitting portion includes light emitting devices 150, an electrode 140 formed on the base, and a wire 160 electrically connecting the electrode 140 to the light emitting device 150.

The light emitting devices 150 may be directly mounted on the PCB 110 by adhesive. Alternatively, the light emitting devices 150 may be mounted on the insulation layer 120 formed on the PCB 110.

Figure 3:
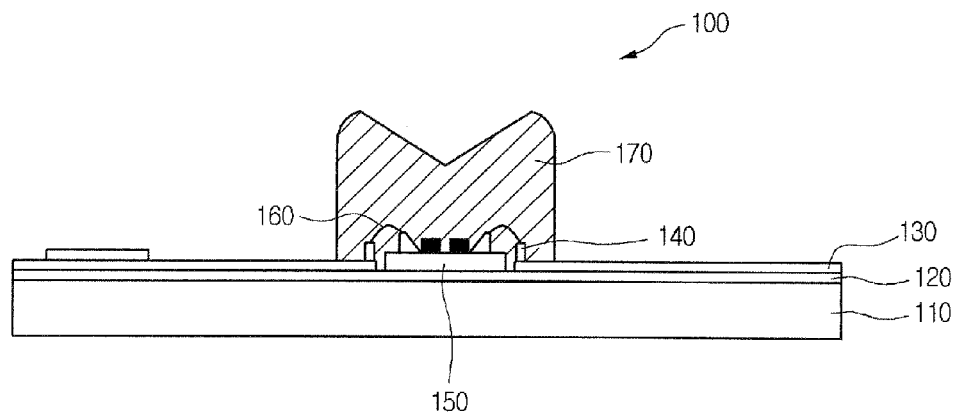
FIG. 3 is a side sectional view of an internal structure of a light emitting device package according to another embodiment of the present invention, where light emitting devices are mounted on an insulation layer.

FIG. 3 shows a light emitting device package according to another embodiment of the present invention, in which a light emitting device 150 is mounted on an insulation layer 120.

A method of manufacturing the light emitting device package 100 will now be described with reference to FIGS. 4 through 11. The light emitting device package 100 may be used as a backlight of an LCD.

Figure 4:
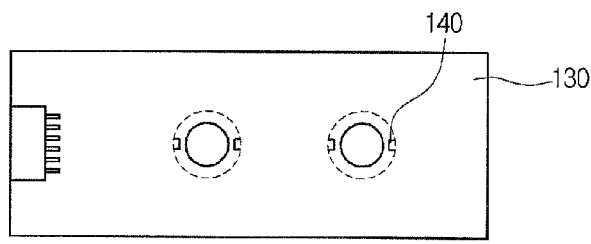
FIG. 4 is a top view of the PCB of FIG. 2 before the light emitting devices are mounted thereon according to an embodiment of the present invention.

FIG. 4 is a top view of the PCB of FIG. 2 before the light emitting devices are mounted thereon.

Referring to FIG. 4, the circulate layer 130 and the insulation layer 120 are removed at a location where the light emitting devices 150 will be formed. A plurality of structures each provided with the electrode 140 are formed around the location.

The PCB 110 may include high heat conductivity metal such as aluminum and copper. Alternatively, the PCB 110 may be formed of a compressed semiconductor-based material. A heat transmission material may be applied to the PCB 110 so as to improve the heat dissipation performance.

That is, the insulation layer 120 is formed on the PCB 110. The insulation layer 120 electrically insulate the circuit layer 130 from the PCB 110. As described above, a portion of the insulation layer 120, where the light emitting devices 150 will be mounted, is removed.

Next, the circuit layer 130 is formed on the insulation layer 120. At this point, likewise the insulation layer 120, a portion of the circuit layer 130, where the light emitting devices 150 will be mounted, is removed.

Meanwhile, when considering the embodiment of FIG. 3, the insulation layer 120 is not removed and the light emitting devices 150 are mounted on the insulation layer 120.

Since the light emitting device package 100 of the present invention has a plurality of the light emitting devices 150 that are formed in an individual module, a circuit for arraying the light emitting devices 150 are formed on the circuit layer 130.

The electrodes 140 are formed on edges of the removed portion of the circuit layer 130. The light emitting devices 150 and the circuit layer 130 are electrically connected to the electrodes by the wires 160.

Figure 5:
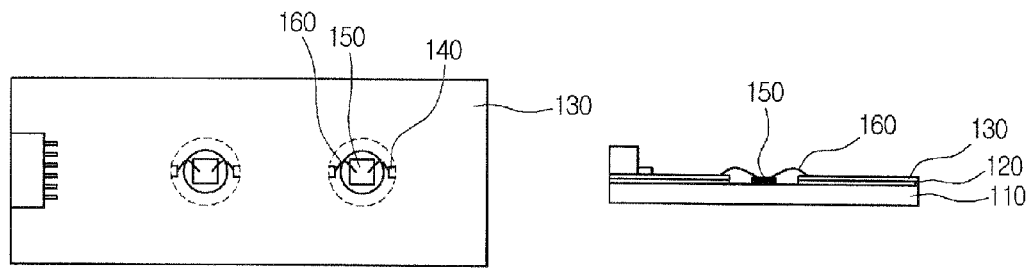
FIG. 5 is top and side views of the PCB of FIG. 2 after the light emitting devices are mounted thereon according to the present invention.

FIG. 5 is top and side views of the PCB after the light emitting devices are mounted thereon according to the present invention.

The light emitting portion includes the light emitting devices 150 and the electrodes 140 transmitting current such that it can be conductive by the circuit layer 130 and the wires 160.

As shown in FIG. 5, the light emitting device package 100 is a chip-on-board (COB) type where the light emitting devices are directly mounted on the PCB 110 to maximize the heat dissipation effect.

In addition, the light emitting devices 150 are LED chips such as silicon optical bench chips (SIOB), red LED chips, green LED chips, yellow LED chips, orange LED chips, and the like. The SIOB chips is provided with cup-shaped spaces in which the LEDs are mounted.

At this point, since the light emitting device package 100 of the present invention has a good color mixing property, a variety of LED chip arrays will be possible.

After the insulation layer 120 and the circuit layer 130 are formed, the light emitting devices 150 are bonded on the PCB 110 and the light emitting devices 150 and the electrodes 140 are interconnected by the wires 160. The molding portion 170 is formed on the resulting structure. At this point, since the molding portion 170 is formed through the transfer molding process without using an additional structure such as a lens structure or a molding support structure, the heat dissipation effect can be further improved.

The process for forming the molding portion 170 using the transfer molding process will be described.

The transfer molding process means a molding method in which a compound having a predetermined viscosity is filled in a mold die engraved in a predetermined shape using heat and pressure and the compound is hardened.

Figure 6:
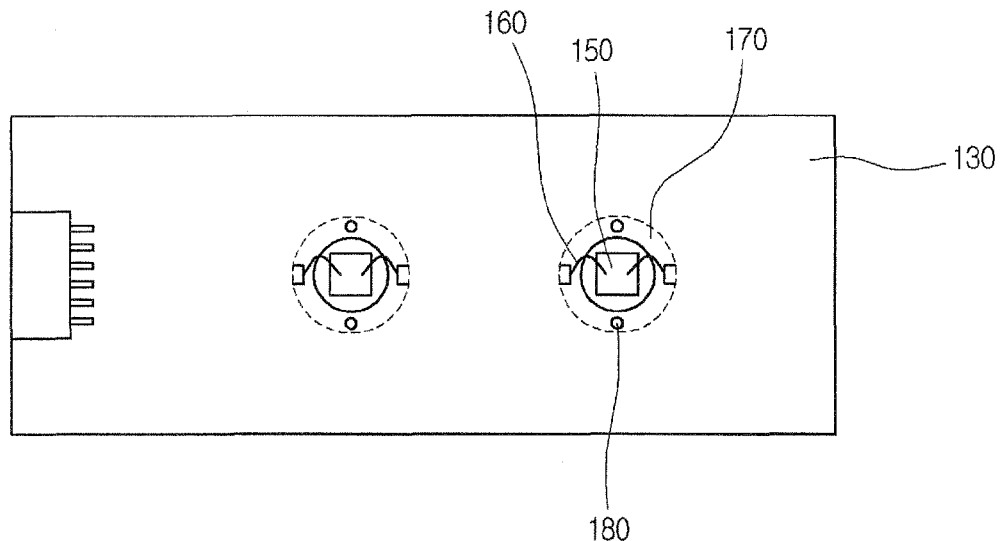
FIGS. 6 through 8 are views of the PCB that has holes used for forming the molding portion.
Figure 7:
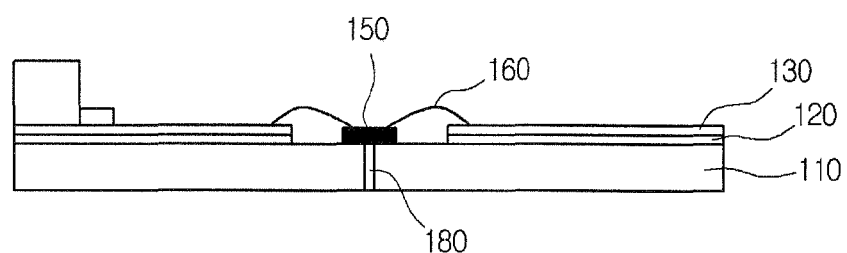

FIGS. 6 and 7 are views of the PCB that has holes used for forming the molding portion. As shown in FIGS. 6 and 7, two holes 180 is formed on the PCB 110 to form one molding portion 170.

Figure 8:
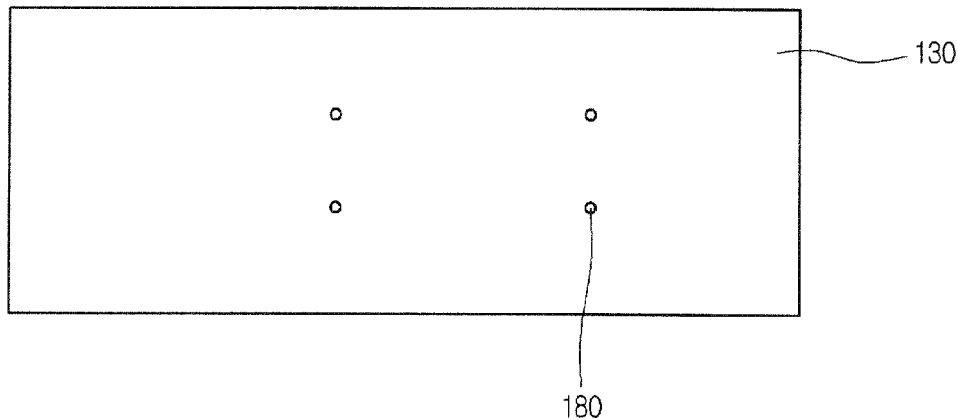

FIG. 8 shows the holes 180 viewed from a bottom side of the PCB 110.

Figure 9:
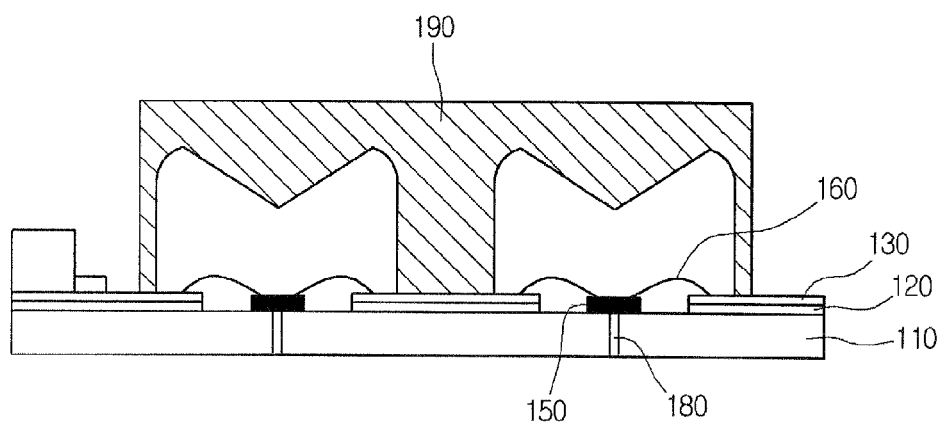
FIGS. 9 and 10 are views illustrating a molding material injection into a mold die to form the molding portion.

After the holes 180 are formed in the PCB 110, as shown in FIG. 9, a mold die 190 engraved with the shape corresponding to the molding portion 170 is disposed on the PCB 110.

Figure 10:
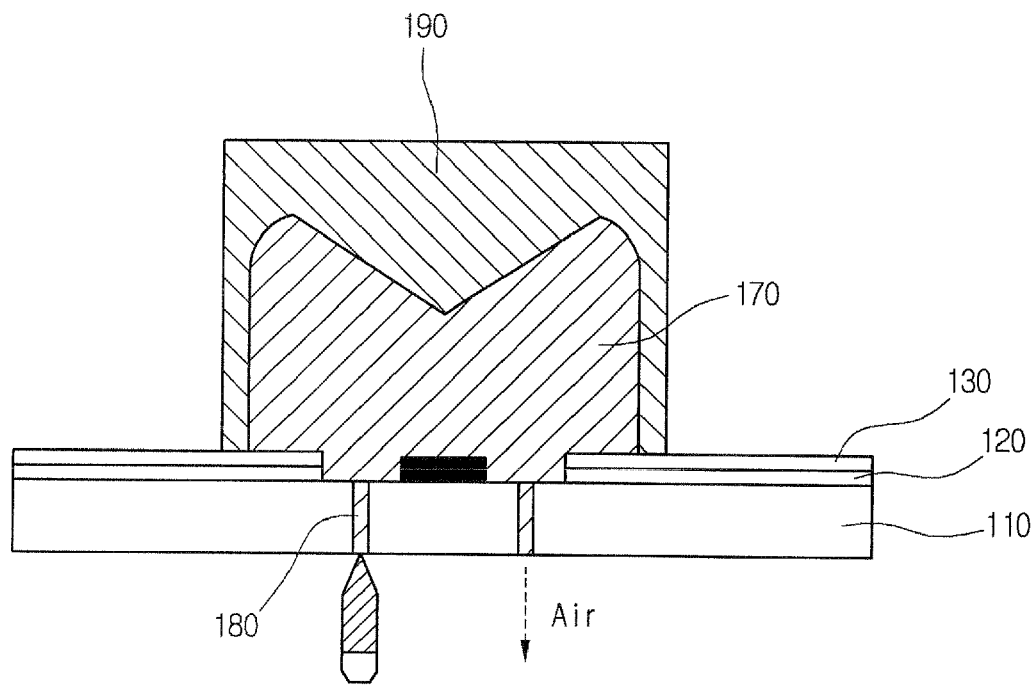

Then, as shown in FIG. 10, a molding material such as epoxy or silicon is injected through one of the holes 180.

That is, two holes 180 are required to form one molding portion 170. That is, the molding material is injected through a first hole 180 and internal air of the mold die 190 is exhausted through a second hole 180 as the molding material is injected through the first hole 180.

Figure 11:
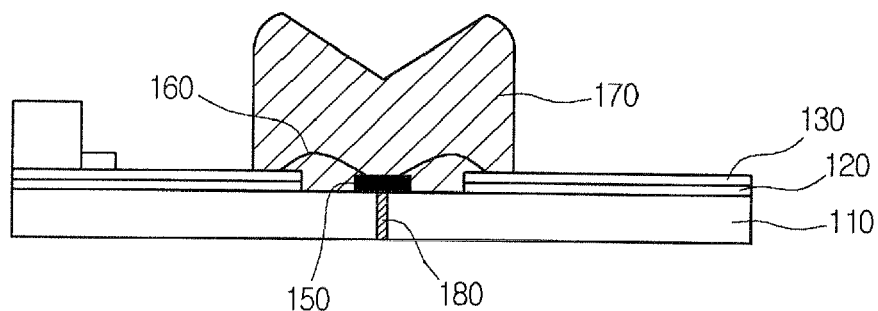
FIG. 11 is top and side views illustrating a state where the light emission device is transfer-molded.

Next, as shown in FIG. 11, when the mold die 190 is removed, the molding portion 170 is completed. At this point, the molding material may be filled in at least a portion of the holes 180 formed in the PCB 110.

As described above, the molding portion 170 is transfer-molded to cover the light emitting devices 150 and the electrodes 140.

Accordingly, there is no need to provide an additional molding support. Furthermore, since the molding portion functions as the molding portion 170, no lens structure is required. That is, while a lens structure is fitted to change the light traveling path in the prior art, the molding portion 170 is formed as a single structure through a minimum process in the present invention.

Meanwhile, the molding portion 170 may be formed through the transfer molding process in either the above-described side emitter type structure or a top emitter type structure. In this case, the molding portion 170 may have a dome-shaped top or a flat-shaped top. The side surfaces of the molding portion 170 are flat so that the overall structure thereof can be a rectangular parallelepiped shape.

Therefore, the light emitting device 150 may be formed in either the top emitter structure or the side emitter structure. For example, when it is intended to form a single color by mixing R, G and B colors, a variety of color mixture ratio can be easily realized through a variety of light traveling paths.

In addition, the molding portion 170 is preferably formed of the epoxy or the silicon material.

Figure 12:
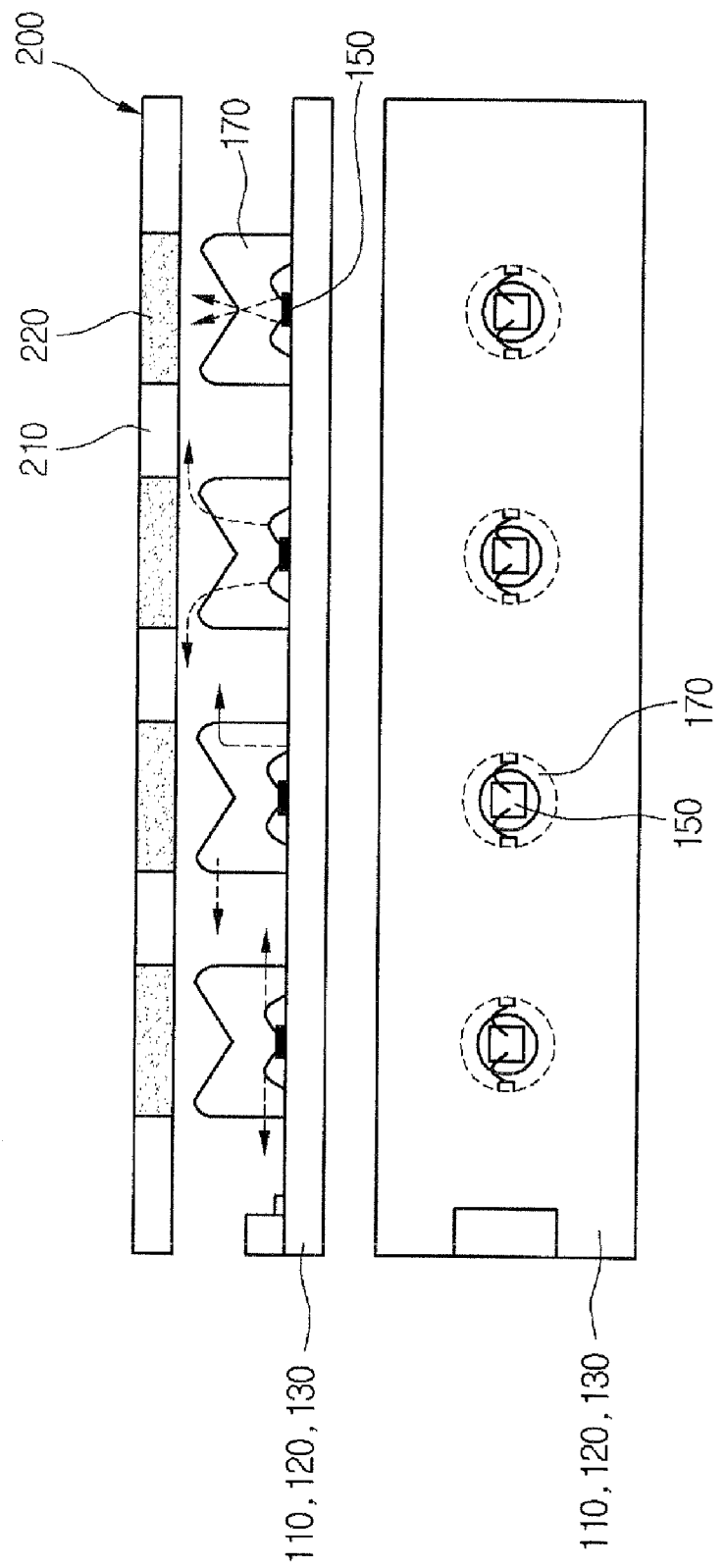
FIG. 12 is top and side views of the light emitting device package 100 on which a diffusing plate 200 is provided.

FIG. 12 is top and side views of the light emitting device package 100 on which a diffusing plate 200 is provided.

Referring to FIG. 12, a plurality of light emitting device modules are molded through the transfer molding process. Each molding portion 170 is the side emitter type.

That is, the molding portion 170 is provided at a top with a conical groove. Therefore, as shown in FIG. 12, the light can be emitted through a variety of paths in the side emitter type molding portion 170 of FIG. 12.

The conical groove has two conical surfaces defining its section can be formed in a variety of angles and thus the light intensities emitted through the top surface and the side surface can be adjusted.

According to the structure of the above-described molding portion 170, a variety of optical structures can be realized according to the arrays of the light emitting devices 150 and a distance (above 5 mm in the conventional art) between the diffusing plate and the LED chips can be reduced. As a result, an overall thickness of the LED panel can be reduced.

The light emitting device package of this embodiment is used as a light source of the backlight unit of the display. A light guide panel (LGP) is provided on the backlight unit and the light emitting devices are disposed below the LGP.

As shown in FIG. 12, the LGP 200 includes diffusing patterns 210 and 220 that is disposed on or above the light emitting devices 150.

The diffusing patterns 210 and 220 function to interrupt unnecessary light emitted from the LED chips so as not to affect the color mixture.

Figure 13:
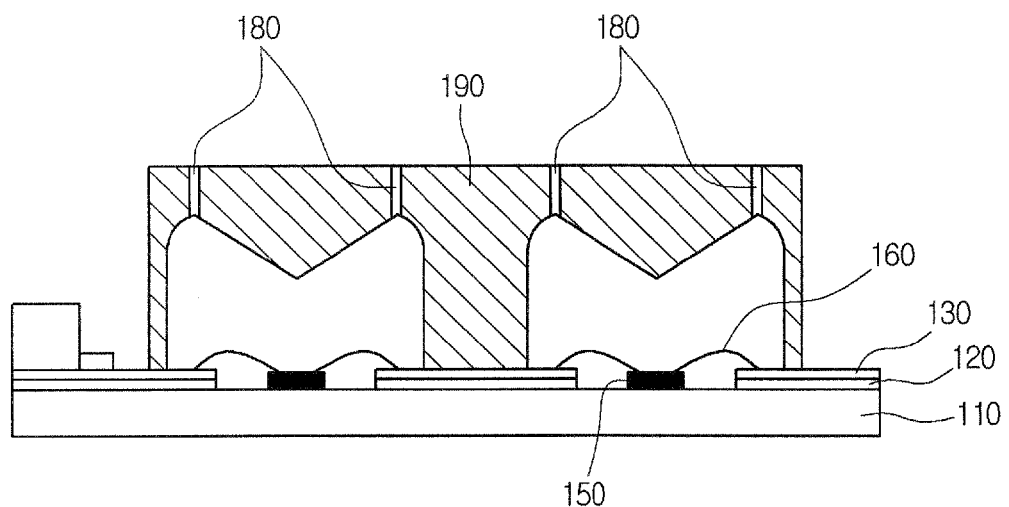
FIGS. 13 and 14 are views of modified example of the transfer molding of the present invention.
Figure 14:
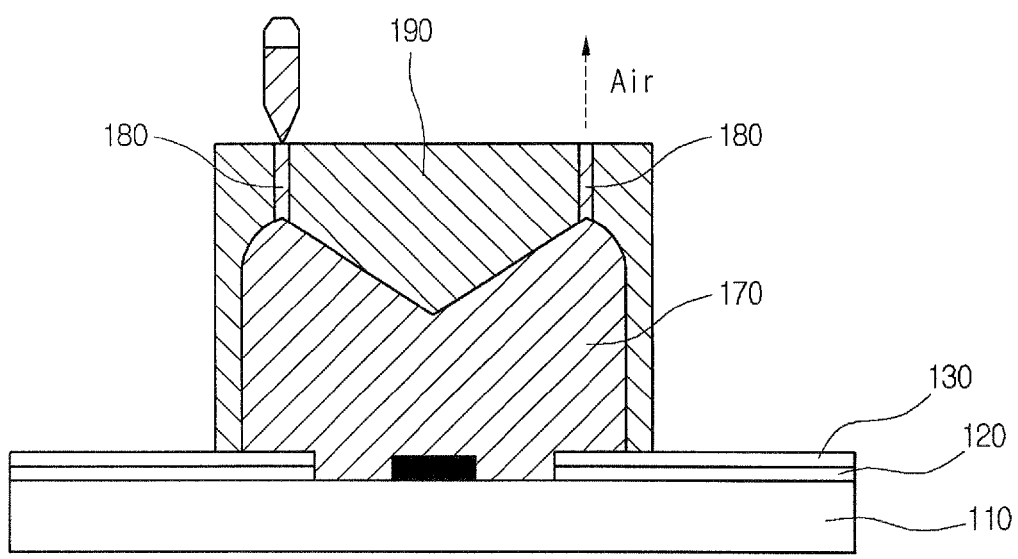

FIGS. 13 and 14 are views of modified example of the transfer molding of the present invention.

Referring to FIGS. 12 and 14, unlike FIGS. 9 and 10, holes 180 are formed on a mold die 190 and a mold material is injected through the hole 180.

According to this modified example, there is no need to form the holes in the PCB 110. That is, since the transfer molding is performed using the mold die 190 on which the holes 180 are formed, the process can be more simplified.

Alternatively, a combination of the example of the FIGS. 9 and 10 and the example of FIGS. 13 and 14 may be used. That is, the holes 180 are formed on not only the mold die 190 but also the PCB 110. The mold material is injected through the hole 180 formed on either the mold die 190 or the PCB 110.

Figure 15:
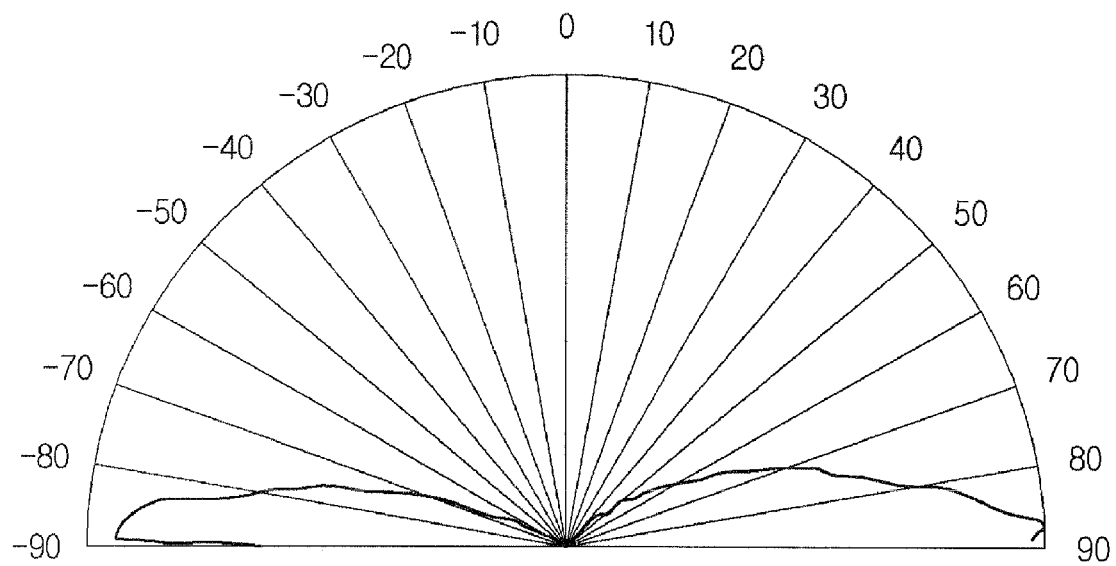
FIG. 15 is a graph illustrating data of a luminous intensity distribution of the side emitter type molding portion 170 according to the present invention.

FIG. 15 is a graph illustrating data of a luminous intensity distribution of the side emitter type molding portion 170 according to the present invention.

Referring to the graph of FIG. 15, the intensity of the light emitted from the molding portion 170 is represented in a state where horizontal reference lines at both sides of the light emitting device package 100 are set from 90° to −90° and a vertical line of the light emitting device package 100 is set 0°. The semi-circulars layered indicate intensities of the light.

Referring to FIG. 15, the light emitting device package 100 of the present invention emits light in a direction within a range of −60° to −90° and 60° to 90°. This shows that the light is concentrated on both sides.

While the present invention has been described and illustrated herein with reference to the preferred embodiments thereof, it will be apparent to those skilled in the art that various modifications and variations can be made therein without departing from the spirit and scope of the invention. Thus, it is intended that the present invention cover the modifications and variations of this invention that come within the scope of the appended claims and their equivalents.

INDUSTRIAL APPLICABILITY

The light emitting device package and the method of manufacturing the light emitting device package can be used in a variety of applications where the light emitting devices are used.

What is claimed is:

1. A backlight unit comprising:
    a board including a top surface and a bottom surface;
    at least two circuit layers on the top surface of the board, wherein the at least two circuit layers include a first circuit layer and a second circuit layer;
    at least one light emitting device on the top surface of the board and electrically connected to the at least two circuit layers, wherein the at least two circuit layers are electrically separated from each other and separately disposed on opposite sides of the at least one light emitting device;
    a lens on the at least one light emitting device and the at least two circuit layers, wherein the lens is disposed on the top surface of the board; and
    a light guide panel on the lens,
    wherein the lens comprises a center recessed portion at a top surface, a flat side surface perpendicular to the top surface of the board, a curved surface connecting the center recessed portion with the flat side surface, and a plurality of protrusion portions protruded in a lower direction on a lower surface of the lens,
    wherein at least one protrusion portion of the plurality of protrusion portions is disposed between the first circuit layer and the at least one light emitting device, and wherein at least one protrusion portion of the plurality of protrusion portions is disposed between the second circuit layer and the at least one light emitting device.

2. The backlight unit according to claim 1, wherein light emitted from the at least one light emitting device through the lens has a peak intensity in a direction within a range of −60° to −90° and 60° to 90°, where both side directions of the at least one light emitting device are set from 90° to −90° and a vertical direction of the at least one light emitting device is set as 0°.

3. The backlight unit according to claim 1, wherein the at least two circuit layers are directly formed on the board.

4. The backlight unit according to claim 1, wherein the lens is directly contacted with the board and the at least two circuit layers.

5. The backlight unit according to claim 1, wherein the at least one light emitting device includes at least one of a red light emitting device, a green light emitting device, a blue light emitting device, a yellow light emitting device, or an orange light emitting device.

6. The backlight unit according to claim 1, wherein the lens includes epoxy or silicon material.

7. The backlight unit according to claim 1, wherein the at least one light emitting device is directly mounted on the board.

8. The backlight unit according to claim 1, wherein the board is formed of a printed circuit board.

9. The backlight unit according to claim 1, wherein the light guide panel includes diffusing patterns.

10. The backlight unit according to claim 9, wherein the diffusing patterns are spaced from each other.

11. The backlight unit according to claim 9, wherein the diffusing patterns are overlapped with the lens in a vertical direction.

* * * * *